United States Patent
Behrends et al.

(10) Patent No.: US 8,669,800 B2
(45) Date of Patent: Mar. 11, 2014

(54) IMPLEMENTING POWER SAVING SELF POWERING DOWN LATCH STRUCTURE

(75) Inventors: Derick G. Behrends, Rochester, MN (US); Todd A. Christensen, Rochester, MN (US); Travis R. Hebig, Rochester, MN (US); Michael Launsbach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 13/404,096

(22) Filed: Feb. 24, 2012

(65) Prior Publication Data
US 2013/0222031 A1 Aug. 29, 2013

(51) Int. Cl.
*H03K 3/289* (2006.01)
(52) U.S. Cl.
USPC ........... 327/202; 327/142; 327/198; 327/208; 327/218; 327/225; 326/95
(58) Field of Classification Search
USPC ......... 327/142, 143, 198–203, 208–215, 218, 327/219, 225; 326/93–98
See application file for complete search history.

(56) References Cited

U.S. PATENT DOCUMENTS

| 5,506,520 | A | 4/1996 | Frank et al. |
| 6,989,702 | B2 | 1/2006 | Ko et al. |
| 7,215,155 | B2 * | 5/2007 | Won .................................. 326/98 |
| 7,583,121 | B2 * | 9/2009 | Berzins et al. ................. 327/202 |
| 7,602,222 | B2 | 10/2009 | Pyeon et al. |
| 7,836,326 | B2 | 11/2010 | Shimada et al. |
| 8,242,826 | B2 * | 8/2012 | Chi et al. ........................ 327/203 |
| 8,381,163 | B2 * | 2/2013 | Schreiber et al. .............. 716/133 |
| 2003/0188241 | A1 * | 10/2003 | Zyuban et al. ................. 714/726 |
| 2009/0116307 | A1 | 5/2009 | Cottier et al. |
| 2009/0315591 | A1 | 12/2009 | Pyeon et al. |
| 2011/0156786 | A1 * | 6/2011 | Yamaguchi ..................... 327/203 |

FOREIGN PATENT DOCUMENTS

| JP | 04180455 A | 6/1992 |
| JP | 2002189439 A | 7/2002 |

* cited by examiner

*Primary Examiner* — Patrick O'Neill
(74) *Attorney, Agent, or Firm* — Joan Pennington (57) ABSTRACT

A method and circuits for implementing power saving self powering down latch operation, and a design structure on which the subject circuit resides are provided. A master slave latch includes a virtual power supply connection. At least one connection control device is coupled between the virtual power supply connection and a voltage supply rail. A driver gate applies a power down signal driving the at least one connection control device to control the at least one connection control device during a self power down mode. The driver gate combines a self power down input signal and a latch data output signal to generate the power down signal.

20 Claims, 13 Drawing Sheets

IMPLEMENTING POWER SAVING SELF POWERING DOWN LATCH STRUCTURE

FIELD OF THE INVENTION

The present invention relates generally to the data processing field, and more particularly, relates to a method and circuit for implementing power saving self powering down latch operation, and a design structure on which the subject circuit resides.

DESCRIPTION OF THE RELATED ART

As integrated chip technology advances to shorter and shorter channel lengths, the leakage power as a percentage of overall power usage continues to increase. To keep overall chip power usage down, a need exists to continually invent ways to reduce power, and to reduce DC leakage power in particular.

A need exists for a circuit having an efficient and effective mechanism for implementing power saving self powering down latch operation.

SUMMARY OF THE INVENTION

Principal aspects of the present invention are to provide a method and circuit for implementing power saving self powering down latch operation, and a design structure on which the subject circuit resides. Other important aspects of the present invention are to provide such method, circuit and design structure substantially without negative effects and that overcome many of the disadvantages of prior art arrangements.

In brief, a method and circuit for implementing power saving self powering down latch operation, and a design structure on which the subject circuit resides are provided. A master slave latch includes a virtual power supply connection. At least one connection control device is coupled between the virtual power supply connection and a voltage supply rail. A driver gate applies a power down signal driving the at least one connection control device to control the at least one connection control device during a self power down mode. The driver gate combines a self power down input signal and a latch data output signal to generate the power down signal.

In accordance with features of the invention, the virtual power supply connection includes the internal high power supply connections in the master slave latch.

In accordance with features of the invention, the virtual power supply connection alternatively includes a virtual ground connection in the master slave latch that is allowed to leak up, for example, close to a positive voltage supply rail during the self power down mode for maximum power savings and a flush function is provided with the master slave latch.

In accordance with features of the invention, the master slave latch includes a flush function for maintaining the original latch state prior to the self power down mode when exiting out of the self power down mode. For example, the flush signal forces both the master and slave clocks to be open when the flush signal is a one.

In accordance with features of the invention, the driver gate is implemented with a NOR gate combining the self power down signal and the predefined latch output to turn off the connection control device during a self power down mode. For example, the at least one connection control device is implemented with a P-channel field effect transistor (PFET) and an N-channel field effect transistor (NFET). For example, the NOR gate receives the self power down signal of a zero and with a zero at the predefined latch output, applies a high gate input to turn off the PFET and to turn on the NFET during the self power down mode.

In accordance with features of the invention, the driver gate is implemented with a AND gate combining the self power down signal and the predefined latch output to turn off the connection control device during a self power down mode. For example, the connection control device is implemented with a P-channel field effect transistor (PFET). For example, the AND gate receives the self power down signal of a one and with a one at the predefined latch output, applies a high gate input to turn off the PFET during the self power down mode.

In accordance with features of the invention, the driver gate is implemented with a NAND gate combining the self power down signal and the predefined latch output to turn off the connection control device during a self power down mode. For example, the connection control device is implemented with an N-channel field effect transistor (NFET). For example, the NAND gate receives the self power down signal of a one and with a one at the predefined latch output, applies a low gate input to turn off the NFET during the self power down mode.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits for implementing power saving self powering down latch operation in accordance with preferred embodiments, and a design structure on which the subject circuits resides are provided.

The present invention provides a way to have a significant reduction in leakage power for circuit paths in which a value is propagated through a series of latches to a termination point and then is held constant for a long time before it is expected to switch again. This situation is quite common in integrated circuit design. A particular example is when control signals for Local Clock Buffers (LCBs) propagate from a central point in the chip and are fanned out across the entire chip using a large number of stages in the chain and terminate at each of the local clock buffers with the same number of latches in the chain no matter where the LCBs are located. These latch chains can be used to pipeline control signals to the LCBs to put them into hold or scan mode and keep in perfect synchronization.

The novel circuit of the invention automatically begins to reduce leakage immediately after the final value is propagated through the latch. This is accomplished by activating a header device to start to lower the virtual supply voltage connecting to the latch.

Figure 1:
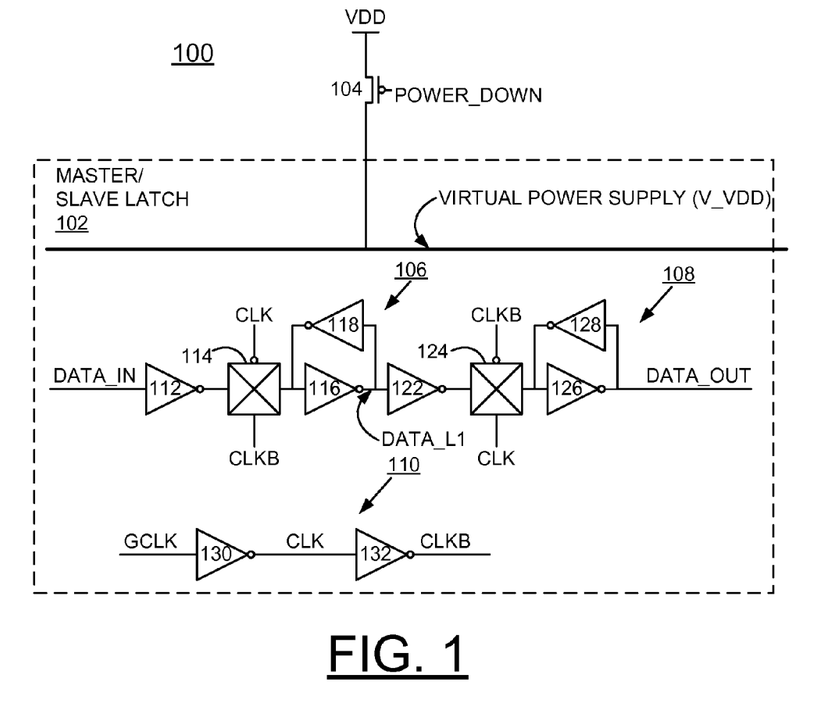
FIGS. 1 and 2 respectively provide a schematic and block diagram representation illustrating an example master slave latch circuit and an example latch chain circuit with master slave latches of FIG. 1 for implementing power saving self powering down latch in accordance with a preferred embodiment.
Figure 2:
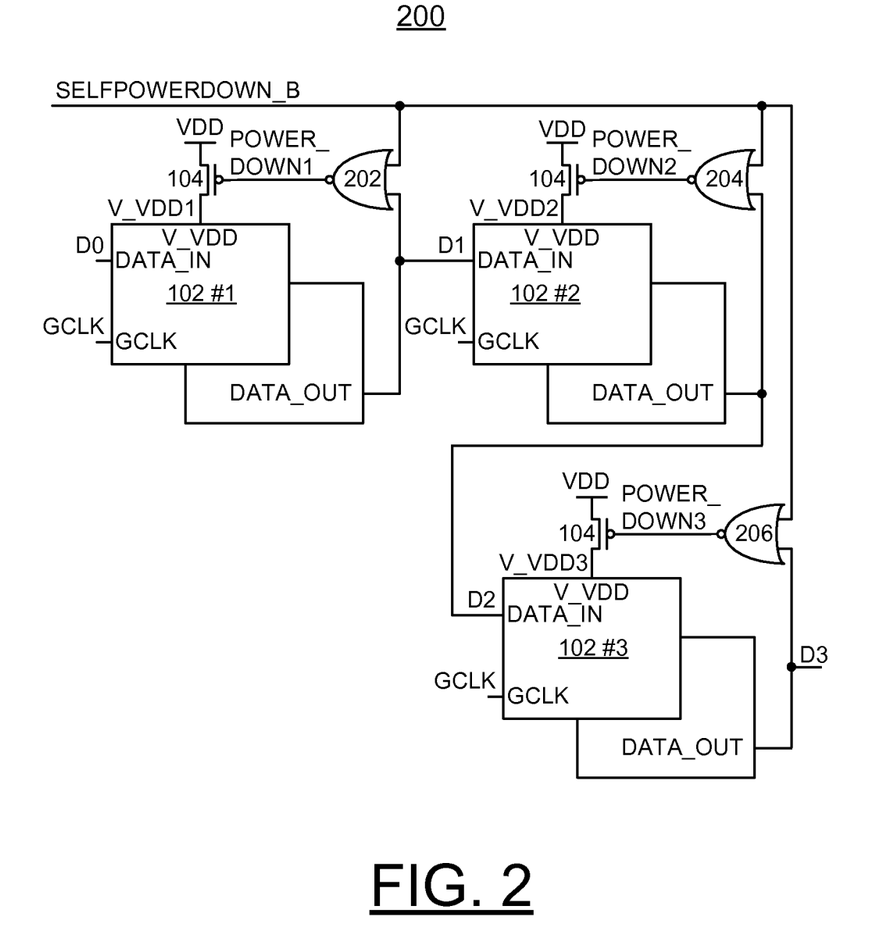

Having reference now to the drawings, in FIGS. 1, and 2, there are shown respective example latch circuit and latch chain circuit for implementing power saving self powering down latching respectively generally designated by the reference characters 100, and 200 in accordance with a preferred embodiment.

Circuit 100 includes a master slave latch 102 including a virtual power supply connection V_VDD. A connection control device 104 is coupled between the virtual power supply connection V_VDD and a voltage supply rail VDD. A power down signal POWER_DOWN drives the connection control device 104 to turn off the connection control device during a self power down mode.

The virtual power supply connection V_VDD includes all of the internal high power supply connections in the master slave latch 102. The connection control device 104 is implemented with a P-channel field effect transistor (PFET). A high gate input is applied to turn off the PFET 104 during the self power down mode.

The master slave latch 102 includes a master latch generally designated by the reference character 106, a slave latch generally designated by the reference character 108, and a clock circuit generally designated by the reference character 110. The master slave latch 102 includes an input DATA_IN applied to the master latch 106, which provides an output DATA_L1 applied to the slave latch 108, which provides an output DATA_OUT of the master slave latch.

The master latch 106 includes an inverter 112 receiving and inverting the input DATA_IN and coupled to a pass gate 114, and a pair of cross-coupled inverters 116, 118 forming a storage cell. The slave latch 108 includes an inverter 122 receiving and inverting the input DATA_L1 and coupled to a pass gate 124, and a pair of cross-coupled inverters 126, 128 forming a storage cell. The clock circuit 110 includes a first inverter 130 receiving and inverting an input grid clock GCLK and applying an inverted clock CLK to a second inverter 132 providing a second inverted output clock CLKB. The clock signals CLK, CLKB are applied to respective opposite inputs of the pass gates 114, 124.

Latch chain circuit 200 for implementing power saving self powering down latching includes a chain of master slave latches 102, #1, #2, #3. Each of the master slave latches 102, #1, #2, #3 receives the input grid clock GCLK. Each of the master slave latches 102, #1, #2, #3 receives a respective data input D0, D1, D2 applied to the input DATA_IN in the chain and provides a respective data output D1, D2, D3. Each of the master slave latches 102, #1, #2, #3 includes a respective NOR gate 202, 204, 206 providing a respective power down signal POWER_DOWN1, POWER_DOWN2, POWER_DOWN3, which drives the respective connection control device 104 to turn off the connection control device during the self power down mode. Each of the respective NOR gates 202, 204, 206 receives a first input SELFPOWERDOWN_B and the respective latch data output D1, D2, D3.

Figure 3:
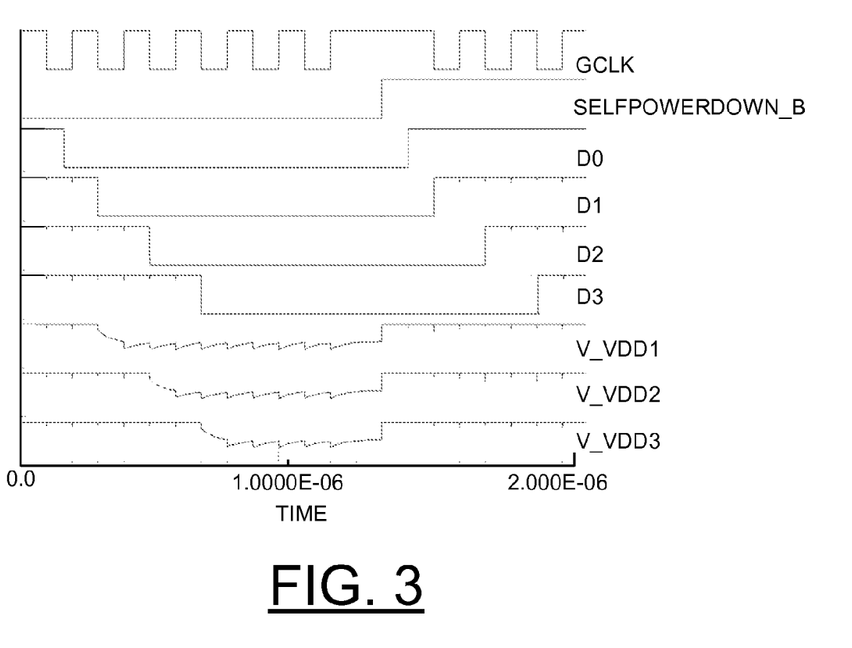
FIG. 3 are waveform diagrams illustrating example operations of the latch chain circuit of FIG. 2 for implementing power saving self powering down latch operation in accordance with a preferred embodiment.

Referring to FIG. 3, there are shown waveform diagrams illustrating example operations of the latch chain circuit 200 for implementing power saving self powering down latch operation in accordance with a preferred embodiment. The illustrated waveforms include the clock input GCLK, the NOR gate input SELFPOWERDOWN_B, the data input D0, latch data outputs D1, D2, D3, and the respective virtual power supply connection inputs V_VDD1, V_VDD2, V_VDD3.

As shown, a zero value on the DATA_OUT or D1, D2, D3 of the chained master slave latches 102, #1, #2, #3 will activate the self power down feature of the invention when the SELFPOWERDOWN_B signal is a zero. As the zero is propagated from D0 to D1 to D2 to D3, the header connection control PFET 104 for each individual master slave latch 102, #1, #2, #3 is turned off which allows each of the virtual power supply connection V_VDD to start leaking down toward ground.

The waveforms in FIG. 3 illustrate a typical example sequence of events. For example, each of the master slave latches 102, #1, #2, #3 contains a one from previous operations. With SELFPOWERDOWN_B set to a zero, D0 is set to a zero and the grid clock GCLK toggles to start loading the latches 102, #1, #2, #3. As the 0 propagates to the first master slave latch output D1, the POWER_DOWN1 signal applied to PFET 104 goes to a 1, turning off the PFET. At this point the virtual power supply connection V_VDD1 starts to leak down from VDD or a 1 toward ground. The voltage that the virtual power supply droops down to is dictated by the strength of the header device PFET 104 versus the leakage of the master slave latch 102. The virtual supply voltage will reach equilibrium when the leakage of the header PFET 104 equals the leakage of all other devices of the master slave latch 102 connected to the PFET. A higher or harder to turn on threshold voltage for the PFET 104 will reduce the leakage current through the PFET 104 resulting in a lower virtual supply voltage V_VDD1. A similar effect is accomplished with the channel width or length of the header device PFET 104 which affects the strength of the header device. In the example chain latch circuit 200, the state in the latch is maintained when the virtual power supply V_VDD is restored back to a 1. As the 0 propagates through the series of latches 102, #1, #2, #3, each V_VDD1, V_VDD2, V_VDD3 starts to droop to ~½ of VDD thus maintaining the state in each respective latch when SELFPOWERDOWN_B returns to a 1. The waveforms show that after the SELFPOWERDOWN_B returns to 1, the 0s are maintained in the latches 102, #1, #2, #3 and then loading 1 s back into the latch chain can be provided to start the sequence again. In this example, the leakage current is reduced by roughly half during the self power down mode.

Figure 4:
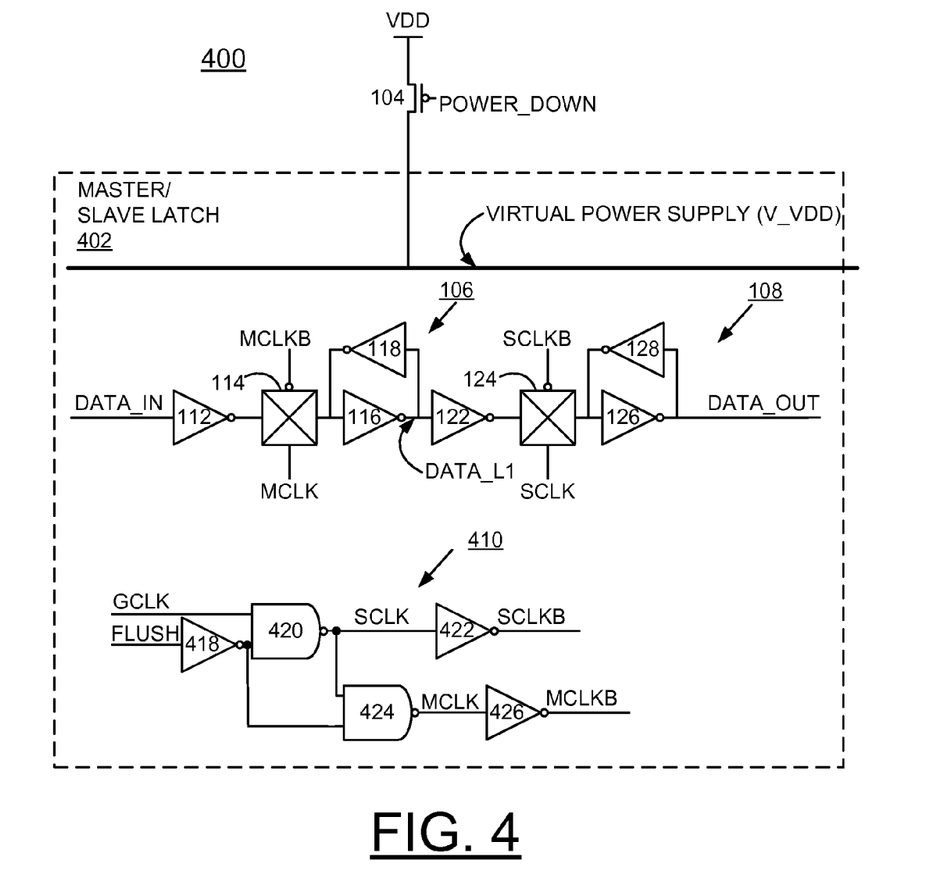
FIGS. 4 and 5 respectively provide a schematic and block diagram representation illustrating an example master slave latch circuit including a flush function and an example latch chain circuit with master slave latches of FIG. 4 including a flush function for implementing power saving self powering down latch in accordance with a preferred embodiment.
Figure 5:
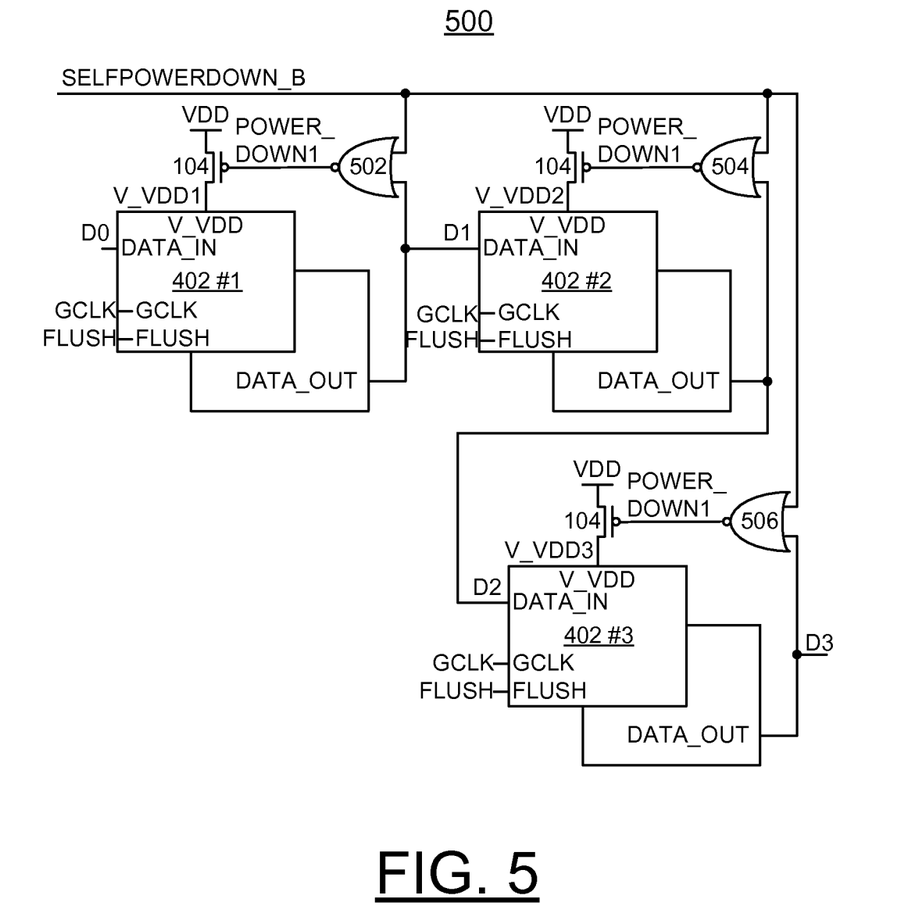

FIGS. 4 and 5 respectively provide a schematic and block diagram representation illustrating an example master slave latch circuit including a flush function and an example latch chain circuit with the master slave latches including the flush function for implementing power saving self powering down latch respectively generally designated by the reference characters 400, and 500 in accordance with a preferred embodiment. Master slave latch circuit 400 and latch chain circuit 500 include similar or identical connections and components as circuits 100, 200 that are identified by the same references and reference numbers as components of circuits 100, 200 in FIGS. 1 and 2. Master slave latch circuit 400 and latch chain circuit 500 allows a much larger reduction in leakage current and allows the state of the latches to be maintained when coming out of self power down mode.

Master slave latch circuit 400 includes a master slave latch 402 including the virtual power supply connection V_VDD. The connection control device 104 is coupled between the virtual power supply connection V_VDD and a voltage supply rail VDD with the power down signal POWER_DOWN that drives the connection control PFET 104 to turn off the connection control device during a self power down mode. The master slave latch 402 similarly includes the master latch 106 and the slave latch 108. The master latch 106 includes the inverter 112 receiving and inverting the input DATA_IN and coupled to the pass gate 114, and the pair of cross-coupled inverters 116, 118 forming a storage cell. The slave latch 108 includes the inverter 122 receiving and inverting the input DATA_L1 and coupled to the pass gate 124, and the pair of cross-coupled inverters 126, 128 forming a storage cell.

The master slave latch 402 includes a clock circuit 410 including a flush function with a flush input FLUSH applied to a first inverter 418 coupled to an input of a NAND gate 420 with an input grid clock GCLK coupled to another input of the NAND gate 420. The output SCLK of NAND gate 420 is applied to an inverter 422, which provides an inverted output SCLKB. The inverted flush output of inverter 418 and the output of NAND gate 420 are applied to a second NAND gate 424. The output MCLK of NAND gate 424 is applied to an inverter 426 providing a second inverted output clock MCLKB. The clocks MCLKB, MCLK, and SCLK, SCLKB are applied to respective opposite inputs of the pass gates 114, 124. The flush input FLUSH added to the master slave latch 402 forces both the master clocks MCLKB, MCLK and slave clocks SCLK, SCLKB to be open when flush is a 1.

Latch chain circuit 500 for implementing power saving self powering down latching includes a chain of master slave latches 402, #1, #2, #3. Each of the master slave latches 402, #1, #2, #3 receives the input grid clock GCLK and the flush input FLUSH. Each of the master slave latches 402, #1, #2, #3 receives a respective data input D0, D1, D2 applied to the input DATA_IN in the chain and provides a respective data output D1, D2, D3. Each of the master slave latches 402, #1, #2, #3 includes a respective NOR gate 502, 504, 506 providing a respective power down signal POWER_DOWN1, POWER_DOWN2, POWER_DOWN3, which drives the connection control device 104 to turn off the connection control device during the self power down mode. Each of the respective NOR gates 502, 504, 506 receives a first input SELFPOWERDOWN_B and the respective latch data output D1, D2, D3. Changing the flush signal FLUSH to a 1 prior to SELFPOWERDOWN_B being raised to a 1 and maintaining a 0 on the D0 input results in the latch chain circuit 500 maintaining all 0 values that were present prior to the self power down mode.

Figure 6:
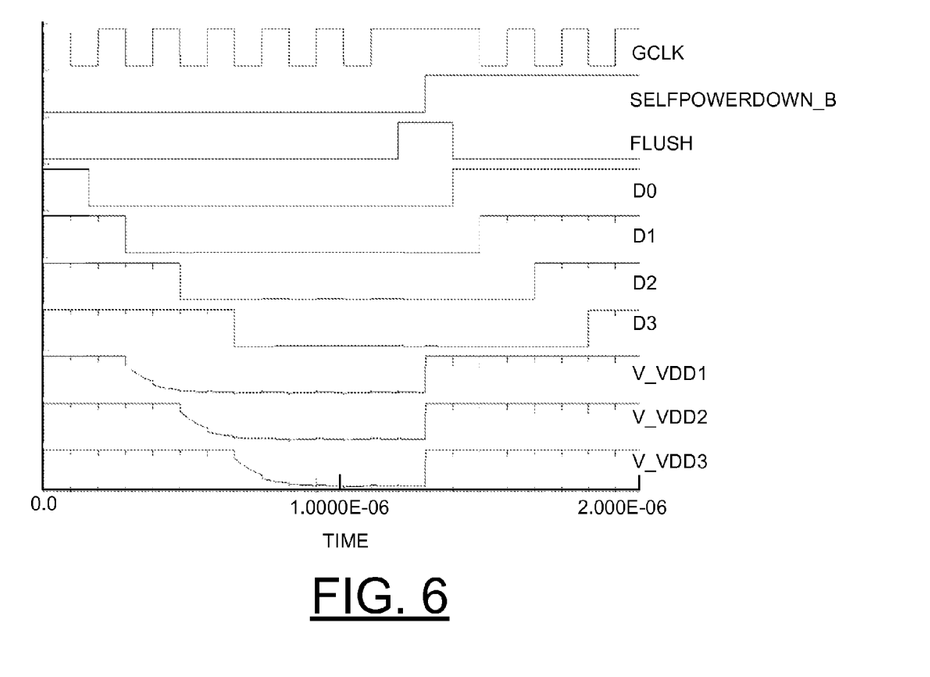
FIG. 6 are waveform diagrams illustrating example operations of the latch chain circuit of FIG. 5 for implementing power saving self powering down latch operation in accordance with a preferred embodiment.

FIG. 6 illustrates example operations of the latch chain circuit 500 for implementing power saving self powering down latch operation in accordance with a preferred embodiment. In the waveforms in FIG. 6, the virtual power supply voltage V_VDD1, V_VDD2, V_VDD3 falls very close to ground in self power down mode resulting in reducing the leakage current by orders of magnitude. The waveforms show flush transitioning to a 1 and then SELFPOWERDOWN_B transitioning to a 1. With D0 at a 0, this forces all latch outputs D1, D2, D3 to be a 0 when exiting out of self power down mode, thus maintaining the original latch state prior to self power down mode.

Figure 7:
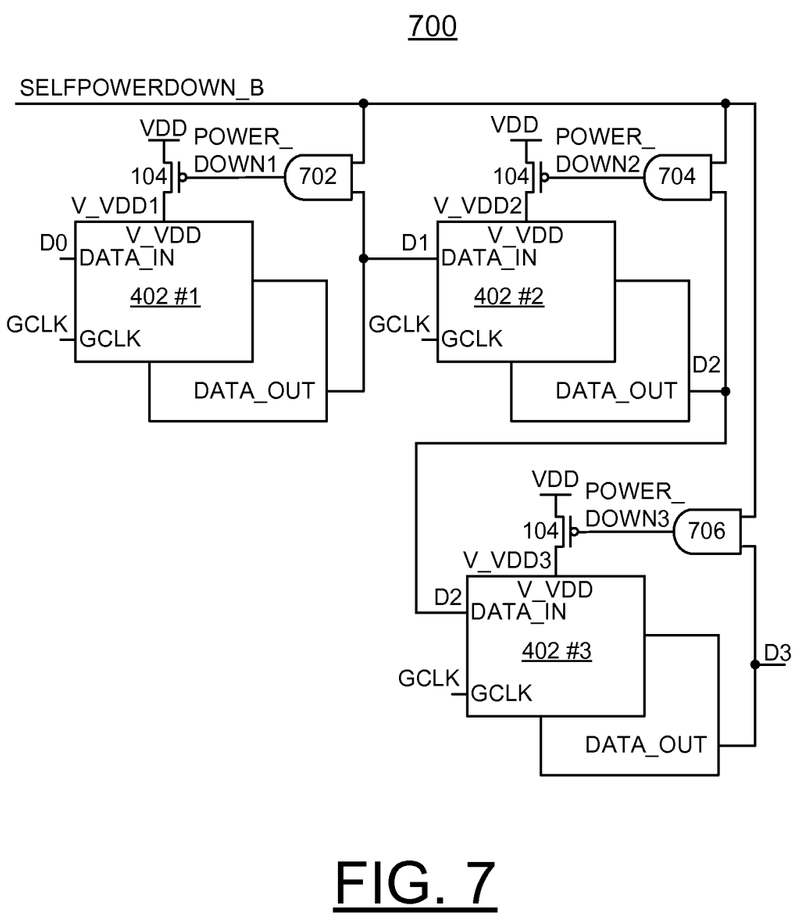
FIG. 7 illustrates an example latch chain circuit with master slave latches including self powering down in accordance with a preferred embodiment.

FIG. 7 illustrates another example latch chain circuit with master slave latches including self powering down generally designated by the reference characters 700 in accordance with a preferred embodiment. Latch chain circuit 700 for implementing power saving self powering down latching includes a chain of master slave latches 402, #1, #2, #3. Each of the master slave latches 402, #1, #2, #3 receives the input grid clock GCLK. Each of the master slave latches 402, #1, #2, #3 receives a respective data input D0, D1, D2 applied to the input DATA_IN in the chain and provides a respective data output D1, D2, D3. Each of the master slave latches 402, #1, #2, #3 includes a respective AND gate 702, 704, 706 providing a respective power down signal POWER_DOWN1, POWER_DOWN2, POWER_DOWN3, which drives the connection control device 104 to turn off the connection control device during the self power down mode. Each of the respective AND gates 702, 704, 706 receives a first input SELFPOWERDOWN_B and the respective latch data output D1, D2, D3.

Figure 8:
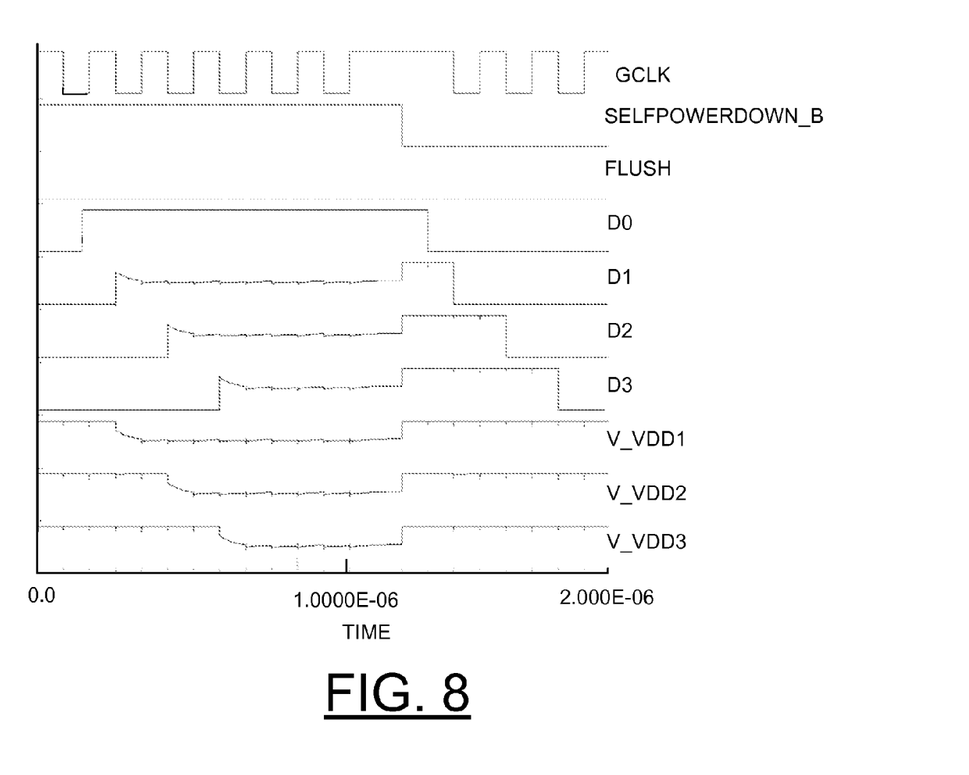
FIG. 8 are waveform diagrams illustrating example operations of the latch chain circuit of FIG. 7 for implementing power saving self powering down latch operation in accordance with a preferred embodiment.

FIG. 8 are waveform diagrams illustrating example operations of the latch chain circuit 700 of FIG. 7 for implementing power saving self powering down latch operation in accordance with a preferred embodiment. As shown, a one value on the DATA_OUT or D1, D2, D3 of the chained master slave latches 402, #1, #2, #3 will activate the self power down feature of the invention when the SELFPOWERDOWN_B signal is a one. As the one is propagated from D0 to D1 to D2 to D3, the header PFET 104 for each individual master slave latch 402, #1, #2, #3 is turned off which allows each of the virtual power supply connection V_VDD to start leaking down toward ground.

Figure 9:
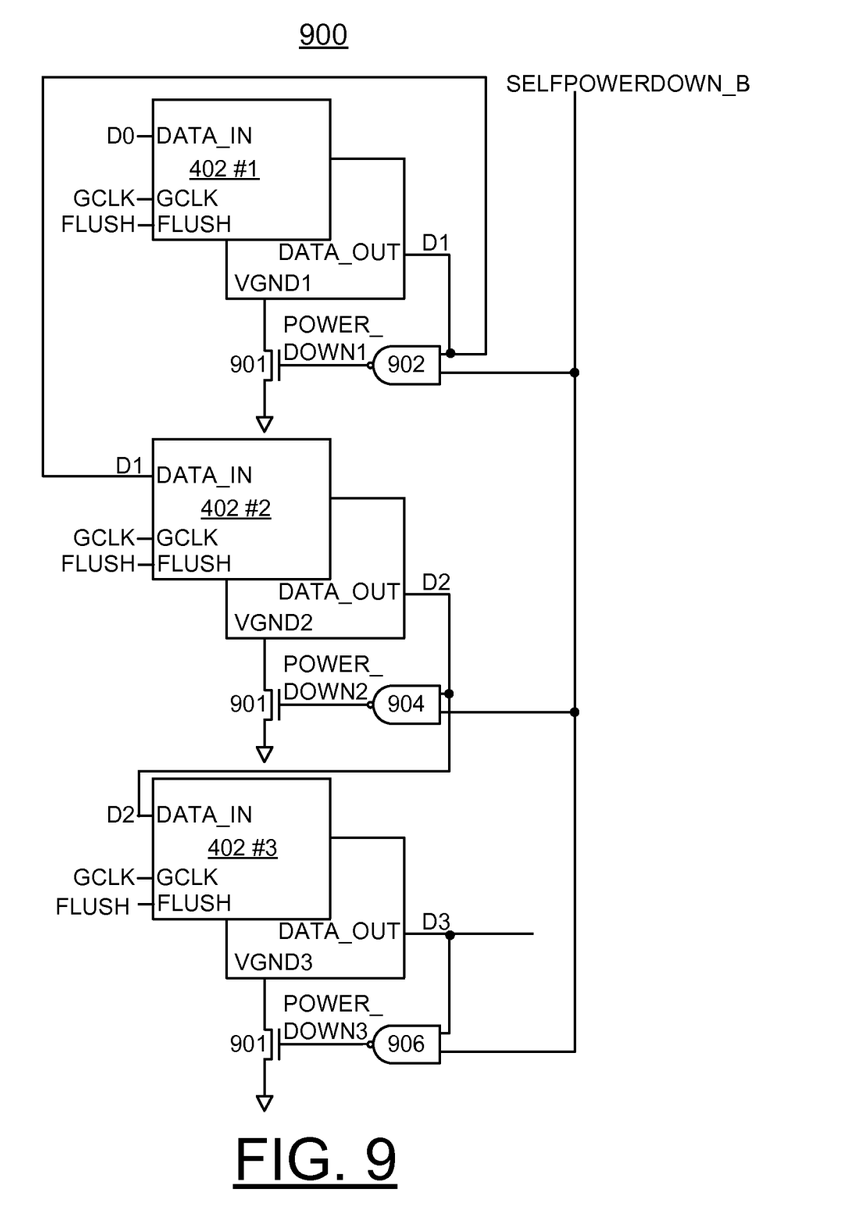
FIG. 9 illustrates an example latch chain circuit with master slave latches including footers and a flush function for implementing power saving self powering down latch in accordance with a preferred embodiment.

FIG. 9 illustrates an example latch chain circuit with master slave latches including footers and a flush function for implementing power saving self powering down latch generally designated by the reference characters 900 in accordance with a preferred embodiment. Latch chain circuit 900 for implementing power saving self powering down latching includes a chain of master slave latches 402, #1, #2, #3. Each of the master slave latches 402, #1, #2, #3 receives the input grid clock GCLK and the flush input FLUSH. Each of the master slave latches 402, #1, #2, #3 receives a respective data input D0, D1, D2 applied to the input DATA_IN in the chain and provides a respective data output D1, D2, D3. Each of the master slave latches 402, #1, #2, #3 includes a respective virtual ground connection VGND1, VGND2, VGND3. Each of the master slave latches 402, #1, #2, #3 includes a connection control footer device 901 and a respective NAND gate 902, 904, 906 providing a respective power down signal POWER_DOWN1, POWER_DOWN2, POWER_DOWN3, which drives the connection control footer device 901 to turn off the connection control device 901 during the self power down mode. The connection control footer device 901 is implemented by an N-channel field effect transistor (NFET). Each of the respective NAND gates 902, 904, 906 receives a first input SELFPOWERDOWN_B and the respective latch data output D1, D2, D3.

Figure 10:
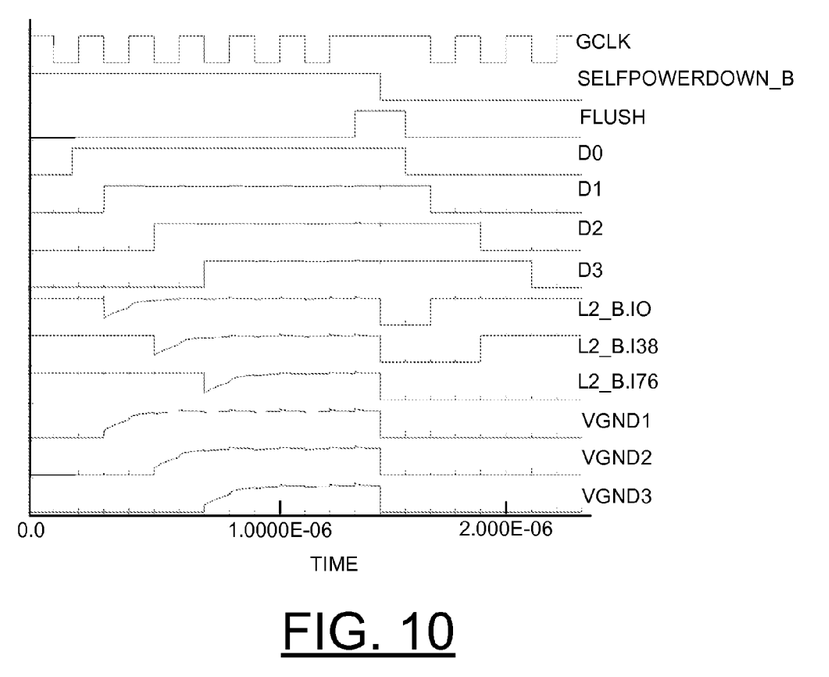
FIG. 10 are waveform diagrams illustrating example operations of the latch chain circuit of FIG. 9 for implementing power saving self powering down latch operation in accordance with a preferred embodiment.

FIG. 10 are waveform diagrams illustrating example operations of the latch chain circuit of FIG. 9 for implementing power saving self powering down latch operation in accordance with a preferred embodiment. As shown, a one value on the DATA_OUT or D1, D2, D3 of the chained master slave latches 402, #1, #2, #3 will activate the self power down feature of the invention when the SELFPOWERDOWN_B signal is a one. As the one is propagated from D0 to D1 to D2 to D3, the footer NFET 901 for each individual master slave latch 402, #1, #2, #3 is turned off which allows each of the virtual ground connection VGND1, VGND2, VGND3 to start leaking up toward the voltage supply rail VDD for maximum power savings and thus the flush function is needed to restore the latch state when coming out of power down mode.

Figure 11:
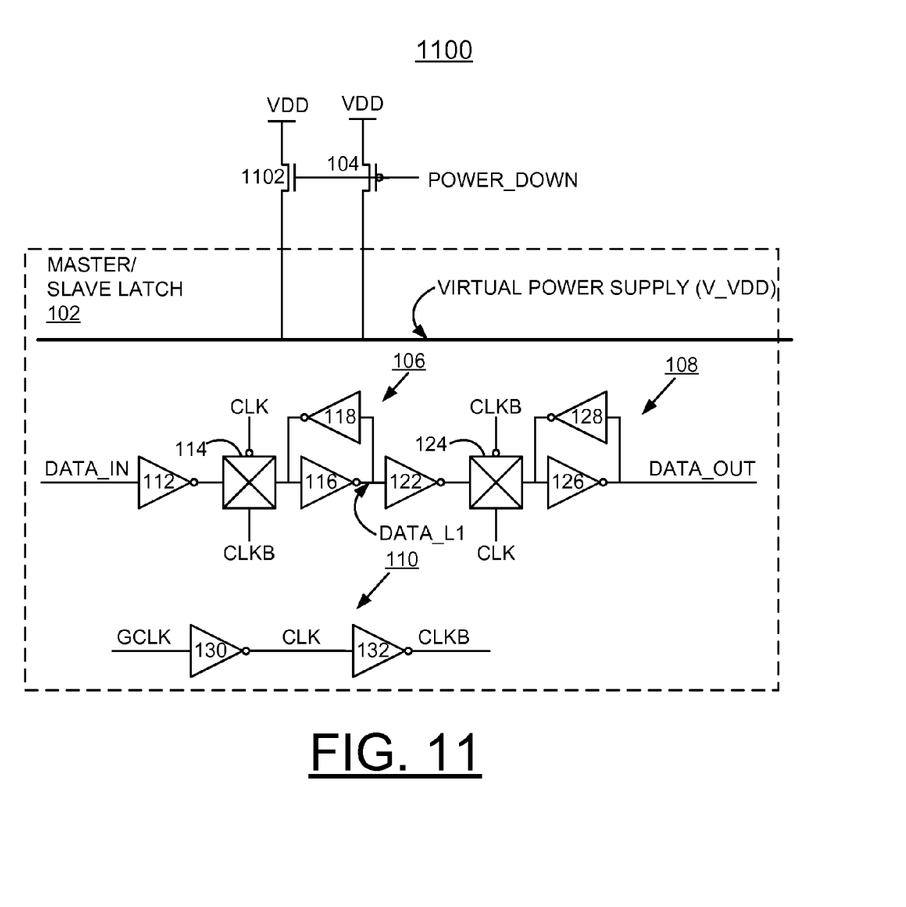
FIGS. 11 and 12 respectively provide a schematic and block diagram representation illustrating another example master slave latch circuit and an example latch chain circuit with master slave latches of FIG. 11 for implementing power saving self powering down latch in accordance with a preferred embodiment.
Figure 12:
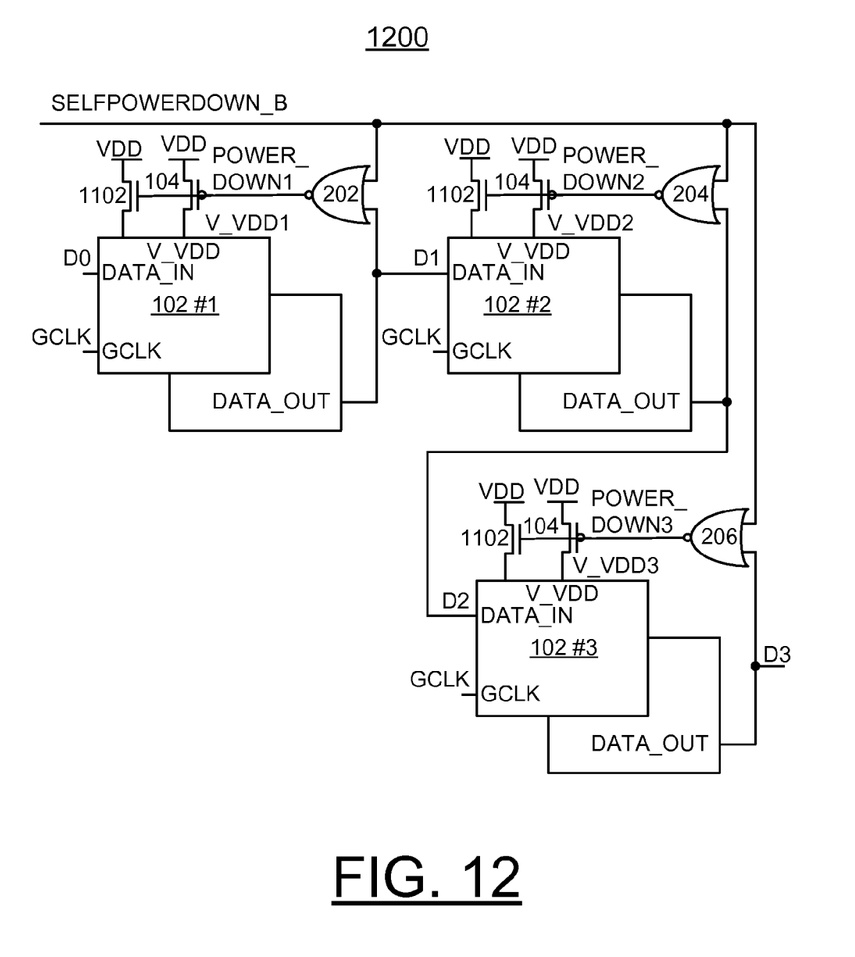

In FIGS. 11, and 12, there are shown another respective example latch circuit and latch chain circuit for implementing power saving self powering down latching respectively generally designated by the reference characters 1100, and 1200 in accordance with a preferred embodiment. Master slave latch circuit 1100 and latch chain circuit 1200 include similar or identical connections and components as circuits 100, 200 that are identified by the same references and reference numbers as components of circuits 100, 200 in FIGS. 1 and 2.

Circuit 1100 includes the master slave latch 102 including a virtual power supply connection V_VDD. The connection control device 104 implemented with a P-channel field effect transistor (PFET) is coupled between the virtual power supply connection V_VDD and a voltage supply rail VDD. Circuit 1100 includes an alternative header implementation with a second header device 1102 implemented with an N-channel field effect transistor (NFET). The power down signal POWER_DOWN drives the PFET header device 104 to turn off the PFET during a self power down mode.

PFET header device 104 applies the full Vdd supply rail onto the virtual supply V_VDD when power down signal POWER_DOWN is a 0. When power down signal POWER_DOWN is a 1, the PFET header device 104 is turned off and the NFET header device 1102 is turned on which results in V_VDD leaking down to a threshold voltage below the full VDD voltage. Typically this is 150-300 mV below VDD and results in the latches maintaining state during power down.

The master slave latch 102 includes a master latch generally designated by the reference character 106, a slave latch generally designated by the reference character 108, and a clock circuit generally designated by the reference character 110. The master slave latch 102 includes an input DATA_IN applied to the master latch 106, which provides an output DATA_L1 applied to the slave latch 108, which provides an output DATA_OUT of the master slave latch.

The master latch 106 includes an inverter 112 receiving and inverting the input DATA_IN and coupled to a pass gate 114, and a pair of cross-coupled inverters 116, 118 forming a storage cell. The slave latch 108 includes an inverter 122 receiving and inverting the input DATA_L1 and coupled to a pass gate 124, and a pair of cross-coupled inverters 126, 128 forming a storage cell. The clock circuit 110 includes a first inverter 130 receiving and inverting an input grid clock GCLK and applying an inverted clock CLK to a second inverter 132 providing a second inverted output clock CLKB. The clock signals CLK, CLKB are applied to respective opposite inputs of the pass gates 114, 124.

Latch chain circuit 1200 for implementing power saving self powering down latching includes a chain of master slave latches 102, #1, #2, #3. Each of the master slave latches 102, #1, #2, #3 receives the input grid clock GCLK. Each of the master slave latches 102, #1, #2, #3 receives a respective data input D0, D1, D2 applied to the input DATA_IN in the chain and provides a respective data output D1, D2, D3. Each of the master slave latches 102, #1, #2, #3 includes a respective NOR gate 202, 204, 206 providing a respective power down signal POWER_DOWN1, POWER_DOWN2, POWER_DOWN3, which drives the respective PFET header device 104 to turn off the PFET header device 104 and to turn on the NFET header device 1102 during the self power down mode. Each of the respective NOR gates 202, 204, 206 receives a first input SELFPOWERDOWN_B and the respective latch data output D1, D2, D3.

It should be understood that similar header modification can be made to the other embodiments of the invention. For example, an NFET header can be added in parallel with PFET 104 in FIGS. 4, 5, and 7 to turn off the PFET header device 104 and to turn on the NFET header device during the self power down mode which results in V_VDD leaking down from a threshold voltage below the full VDD voltage. Also, for example, a PFET footer can be added in parallel the NFET footer 901 in FIG. 9 which results in the virtual ground rising to a PFET threshold voltage above ground when set in self power down mode.

Figure 13:
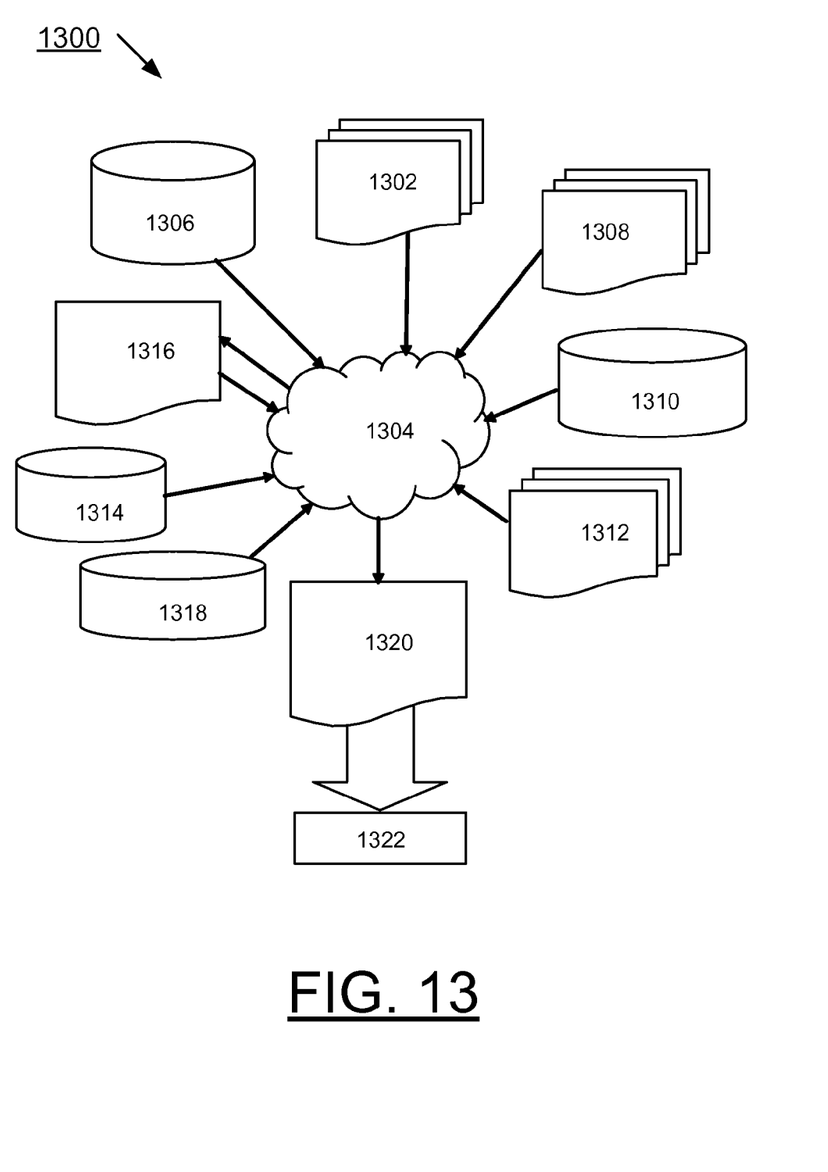
FIG. 13 is a flow diagram of a design process used in semiconductor design, manufacturing, and/or test.

FIG. 13 shows a block diagram of an example design flow 1300. Design flow 1300 may vary depending on the type of IC being designed. For example, a design flow 1300 for building an application specific IC (ASIC) may differ from a design flow 1300 for designing a standard component. Design structure 1302 is preferably an input to a design process 1304 and may come from an IP provider, a core developer, or other design company or may be generated by the operator of the design flow, or from other sources. Design structure 1302 comprises circuits 100, 200, 400, 500, 700, 900, 1100, and 1200 in the form of schematics or HDL, a hardware-description language, for example, Verilog, VHDL, C, and the like. Design structure 1302 may be contained on one or more machine readable medium. For example, design structure 1302 may be a text file or a graphical representation of circuits 100, 200, 400, 500, 700, 900, 1100, and 1200. Design process 1304 preferably synthesizes, or translates, circuits 100, 200, 400, 500, 700, 900, 1100, and 1200 into a netlist 1306, where netlist 1306 is, for example, a list of wires, transistors, logic gates, control circuits, I/O, models, etc. that describes the connections to other elements and circuits in an integrated circuit design and recorded on at least one of machine readable medium. This may be an iterative process in which netlist 1306 is resynthesized one or more times depending on design specifications and parameters for the circuit.

Design process 1304 may include using a variety of inputs; for example, inputs from library elements 1308 which may house a set of commonly used elements, circuits, and devices, including models, layouts, and symbolic representations, for a given manufacturing technology, such as different technology nodes, 32 nm, 45 nm, 90 nm, and the like, design specifications 1310, characterization data 1312, verification data 1314, design rules 1316, and test data files 1318, which may include test patterns and other testing information. Design process 1304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 1304 without deviating from the scope and spirit of the invention. The design structure of the invention is not limited to any specific design flow.

Design process 1304 preferably translates an embodiment of the invention as shown in FIGS. 1, 2, 4, 5, 7, 9, 11, and 12 along with any additional integrated circuit design or data (if applicable), into a second design structure 1320. Design structure 1320 resides on a storage medium in a data format used for the exchange of layout data of integrated circuits, for example, information stored in a GDSII (GDS2), GL1, OASIS, or any other suitable format for storing such design structures. Design structure 1320 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 4, 5, 7, 9, 11, and 12. Design structure 1320 may then proceed to a stage 1322 where, for example, design structure 1320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing power saving self powering down latch operation, said method comprising:
   providing a master slave latch including a virtual power supply connection;
   providing at least one connection control device coupled between the virtual power supply connection and a voltage supply rail;
   providing a driver gate driving the at least one connection control device; and
   providing a self power down input signal and a latch data output signal to said driver gate to control the at least one connection control device during a self power down mode.

2. The method as recited in claim 1 wherein providing a master slave latch including a virtual power supply connection includes providing said virtual power supply connection including each internal high power supply connection in the master slave latch.

3. The method as recited in claim 2 includes implementing said at least one connection control device with at least one field effect transistor (FET).

4. The method as recited in claim 2 includes implementing said driver gate with a NOR gate combining said self power down input signal and said latch data output signal to control said at least one connection control device during the self power down mode.

5. The method as recited in claim 1 includes providing said master slave latch including a flush function for maintaining an original latch state prior to the self power down mode when exiting out of self power down mode.

6. The method as recited in claim 1 wherein providing a master slave latch including a virtual power supply connection includes providing said virtual power supply connection including each virtual ground power supply connection in the master slave latch.

7. A circuit for implementing power saving self powering down latch operation comprising:
   a master slave latch including a virtual power supply connection;
   at least one connection control device coupled between said virtual power supply connection and a voltage supply rail;
   a driver gate driving the connection control device; a self power down input signal and a latch data output signal being applied to said driver gate to control said at least one connection control device during a self power down mode.

8. The circuit as recited in claim 7 wherein said virtual power supply connection includes each internal high power supply connection in the master slave latch.

9. The circuit as recited in claim 7 wherein said virtual power supply connection includes each virtual ground power supply connection in the master slave latch.

10. The circuit as recited in claim 7 includes said at least one connection control device being implemented with at least one field effect transistor (FET).

11. The circuit as recited in claim 7 includes a chain of said master slave latches, a data value being scanned into the chain of said master slave latches by a grid clock during the self power down mode, said at least one connection control device being controlled when said data value is scanned to said latch data output of each said master slave latch in said chain.

12. The circuit as recited in claim 7 wherein said master slave latch includes a flush function for maintaining an original latch state prior to the self power down mode when exiting out of self power down mode.

13. The circuit as recited in claim 12 wherein said flush function includes a flush signal applied to a clock circuit of said master slave latch; said flush signal forcing master clocks and slave clocks to be open when said flush signal is asserted.

14. The circuit as recited in claim 7 wherein said at least one connection control device being implemented with a P-channel field effect transistor (PFET) and an N-channel field effect transistor (NFET) and said driver gate includes a NOR gate; said NOR gate receiving said self power down input signal of a zero and with a zero at the latch data output signal, applying a high gate input to turn off the PFET and to turn on the NFET during the self power down mode.

15. The circuit as recited in claim 7 wherein said at least one connection control device being implemented with a P-channel field effect transistor (PFET) and said driver gate includes an AND gate; said AND gate receiving said self power down input signal of a one and with a one at the latch data output signal, applying a high gate input to turn off the PFET during the self power down mode.

16. The circuit as recited in claim 7 wherein said at least one connection control device being implemented with a N-channel field effect transistor (NFET) and said driver gate includes a NAND gate; said NAND gate receiving said self power down input signal of a one and with a one at the latch data output signal, applying a low gate input to turn off the NFET during the self power down mode.

17. A design structure embodied in a non-transitory machine readable storage medium used in a design process, the design structure comprising:
   a circuit tangibly embodied in the machine readable storage medium used in the design process, said circuit for implementing power saving self powering down latch operation, said circuit comprising:
   a master slave latch including a virtual power supply connection;
   at least one connection control device coupled between said virtual power supply connection and a voltage supply rail;
   a driver gate driving said at least one connection control device;
   a self power down input signal and a latch data output signal being applied to said driver gate to control said at least one connection control device during a self power down mode, wherein the design structure, when read and used in the manufacture of a semiconductor chip produces a chip comprising said circuit.

18. The design structure of claim 17, wherein the design structure comprises a netlist, which describes said circuit.

19. The design structure of claim 17, wherein the design structure resides on storage medium as a data format used for the exchange of layout data of integrated circuits.

20. The design structure of claim 17, wherein the design structure includes at least one of test data files, characterization data, verification data, or design specifications.

* * * * *